US008710876B2

(12) United States Patent
Lobsiger et al.

(10) Patent No.: US 8,710,876 B2
(45) Date of Patent: Apr. 29, 2014

(54) ACTIVE GATE DRIVE CIRCUIT

(71) Applicant: ABB Research Ltd, Zurich (CH)

(72) Inventors: Yanich Lobsiger, Aarau (CH); Johann Walter Kolar, Zurich (CH); Matti Laitinen, Helsinki (FI)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 13/738,624

(22) Filed: Jan. 10, 2013

(65) Prior Publication Data

US 2013/0181750 A1 Jul. 18, 2013

(30) Foreign Application Priority Data

Jan. 13, 2012 (EP) .................................. 12151032

(51) Int. Cl.
*H03B 1/00* (2006.01)

(52) U.S. Cl.
USPC ........................................................ 327/109

(58) Field of Classification Search
CPC ........................................................ H03K 3/00
USPC ........................................................ 327/109
See application file for complete search history.

(56) References Cited

U.S. PATENT DOCUMENTS

| 5,926,012 | A | | 7/1999 | Takizawa et al. | |
|---|---|---|---|---|---|
| 5,952,817 | A | * | 9/1999 | Brewster et al. | ............... 323/268 |
| 6,127,746 | A | | 10/2000 | Clemente | |
| 2010/0060326 | A1 | | 3/2010 | Palmer et al. | |

FOREIGN PATENT DOCUMENTS

DE 197 41 391 A1 3/1998
WO WO 2008/032113 A1 3/2008

OTHER PUBLICATIONS

Europan Search Report issued on Jun. 15, 2012 for Application No. EP 12151032.5.
Shihong Park et al., "Flexible *dv/dt* and *di/dt* Control Method for Insulated Gate Power Switches", IEEE Transactions on Industry Applications, vol. 39, No. 3, May/Jun. 2003, pp. 657-664.
Petar J. Grbovic, "An IGBT Gate Driver for Feed-Forward Control of Turn-On Losses and Reverse Recovery Current", IEEE Transactions on Power Electronics, vol. 23, No. 2, Mar. 2008, pp. 643-652.
Christoph Dorlemann et al., "New IGBT Driver With Independent *dv/dt*-ANA *di/dt*-Feedback Control for Optimized Switching Behavior", Proc. of the 2nd Int. Conf. on Integrated Power Electronic Systems (CIPS), pp. 107-114, 2002.

* cited by examiner

*Primary Examiner* — Daniel Rojas
(74) *Attorney, Agent, or Firm* — Buchanan Ingersoll & Rooney PC

(57) ABSTRACT

Exemplary embodiments are directed to a gate drive circuit and a method for controlling a gate-controlled component. The gate drive circuit includes a PI controller that receives an input reference signal ($v_{ref,d/dt}$) controls a gate voltage of the gate-controlled component. The gate drive circuit also includes a first feedback loop for the PI controller adapted to provide feedback from a time derivative of a collector-to-emitter voltage ($v_{CE}$) of the controlled component. The first feedback loop has a first gain ($k_v$). A second is provided in the gate drive circuit feedback loop for the PI controller that provides feedback from the time derivative of the collector current ($i_C$) of the controlled component. The second feedback loop has second gain ($k_i$) and includes a clipping circuit that modifies the feedback signal in the second feedback loop during turn-on of the controlled component when the time derivative of the collector current is negative.

15 Claims, 3 Drawing Sheets

ACTIVE GATE DRIVE CIRCUIT

RELATED APPLICATION(S)

This application claims priority under 35 U.S.C. §119 to European Patent Application No. 12151032.5 filed in Europe on Jan. 13, 2012, the entire content of which is hereby incorporated by reference in its entirety.

FIELD

The present disclosure relates to gate drivers, and to gate drivers employing closed control loop of current and voltage slope.

BACKGROUND INFORMATION

Insulated gate bipolar transistor (IGBT) modules are widely used in inductive (hard) switching voltage source power electronic converters such as drives, switched-mode power supplies or solid state transformers.

Minimizing switching losses of the IGBT, sticking the current and voltage conditions to the save operating area (SOA), e.g. limiting the turn-off overvoltage and the peak reverse recovery current during turn-on, and restricting electromagnetic interference (EMI) can be a challenging task of the IGBT's gate drive. Setting the collector current slope $di_C/dt$ at turn-on can enable the peak reverse recovery current to be limited, and $di_C/dt$ during turn-off can define the overvoltage that results due to the voltage drop across the total commutation loop inductance $L_\sigma$. To provide electromagnetic compatibility (EMC), as the case may be, the collector-emitter voltage slope $dv_{CE}/dt$ and $di_C/dt$ have to be restricted to specified values.

An independent current and voltage slope control individually for turn-on and turn-off allows the gate drive to optimally switch the IGBT in all operating points with minimal switching losses while sticking to the SOA and providing EMC. In addition, if IGBT modules are directly connected in series or in parallel, the control of $dv_{CE}/dt$ or $di_C/dt$ enables a symmetrical voltage or current sharing.

A simple and common way of adjusting the switching speed of IGBTs is to insert additional passive components into the circuit. Additional gate resistance $R_G$ reduces the gate current and therefore also both current and voltage slopes, extra Miller capacitance $C_{GC}$ lowers $dv_{CE}/dt$ and added gate-emitter capacitance $C_{Ge}$ slows down $di_C/dt$. This approach can lead either to excessive switching losses or to increased delays and gate driving losses due to the larger amount of gate charge that is specified.

To avoid additional gate driving losses, a feed-forward gate voltage shape generator can be used to adjust the $di_C/dt$. An example of this technique is disclosed in P. J. Grbovic, "An IGBT gate driver for feed-forward control of turn-on losses and reverse recovery current," *IEEE Transactions on Power Electronics*, vol. 23, no. 2, pp. 643-652, March 2008. However, in this approach the controllability of the voltage slope is small.

Further possibilities to influence the gate current during the switching transients are for example switchable or adjustable gate resistor(s), current sources/sinks or gate voltages. As the implementation of such gate drives with adjustable output stage has to ensure an operation in the SOA, e.g. limited $di_C/dt$ and $dv_{CE}/dt$, for all operating conditions (varied $T_j$, $i_C$, $v_{CE}$), for most of the operating points the desired optimal current and voltage slopes are not achieved leading to increased switching losses. In addition, the system state of the semiconductor, e.g. the transition from the current to the voltage transients and vice versa, should be detected most accurately in an additional complex circuit, to be able to independently adjust $di_C/dt$ and $dv_{CE}/dt$.

Missing compensation of the IGBT's non-linearities and dependencies on the operating point is a further and main drawback of all these open-loop control topologies. The IGBT's transconductance $g_m$ in fact varies with the gate voltage $V_{Ge}$ and the junction temperature $T_j$ as well as both capacitance values $C_{Ge}$ and $C_{GC}$ depend on the applied voltage, such as the Miller capacitance. With an open-loop approach, accurately defined and constant current and voltage slopes can therefore not be obtained. For that reason, topologies with feedback are applied to achieve more precise control.

Best performance with regard to analog control bandwidth is achieved by means of $di_C/dt$ and $dv_{CE}/dt$ control topologies due to simple and high-bandwidth measurement circuits, easy to generate constant reference value(s) and simple control amplifier stages. Different implementations of only $di_C/dt$ control or individual solutions for current or voltage slope control during turn-on or turn-off has been discussed in S. Park and T. M. Jahns, "Flexible dv/dt and di/dt control method for insulated gate power switches," *IEEE Transactions on Industry Applications*, vol. 39, no. 3, pp. 657-664, 2003.

A complete solution of turn-on and turn-off $di_C/dt$ and $dv_{CE}/dt$ control was disclosed in C. Dorlemann and J. Melbert, "New IGBT driver with independent dv/dt- and di/dt-feedback control for optimized switching behavior," *Proc. of the 2nd Int. Conf. on Integrated Power Electronic Systems (CIPS)*, pp. 107-114, 2002. Due to the implementation with a large amount of bipolar transistors and an active detection and selection of the control loop, the performance was limited to 200 A/μs and 1 kV/μs.

SUMMARY

An exemplary gate drive circuit for controlling a gate-controlled component is disclosed. The circuit comprising: a PI controller configured to receive an input reference signal ($v_{ref,d/dt}$) and to control a gate voltage of the gate-controlled component; a first feedback loop for the PI controller that provides feedback from a time derivative of a collector-to-emitter voltage ($v_{CE}$) of the controlled component, the first feedback loop having first gain ($k_v$), and a second feedback loop for the PI controller that provides feedback from a time derivative of the collector current ($i_C$) of the controlled component, the second feedback loop having second gain ($k_i$), wherein the second feedback loop includes a clipping circuit that modifies the feedback signal in the second feedback loop during turn-on of the controlled component when the time derivative of the collector current is negative.

An exemplary method for controlling a gate-controlled component by using a PI controller adapted to receive an input reference signal ($v_{ref,d/dt}$) and to control a gate voltage of the gate-controlled component is disclosed, the method comprising: providing the input reference signal ($v_{ref,d/dt}$) to the PI controller; obtaining, via a first feedback loop, a first feedback signal for the PI controller from a time derivative of a collector-to-emitter voltage ($v_{CE}$) of the controlled component; obtaining, via a second feedback loop, a second feedback signal for the PI controller from the time derivative of the collector current ($i_C$) of the controlled component; and modifying the feedback signal in the second feedback loop during turn-on of the controlled component when the time derivative of the collector current is negative.

BRIEF DESCRIPTION OF THE DRAWINGS

In the following the disclosure will be described in greater detail by means of exemplary embodiments with reference to the accompanying drawings, in which.

DETAILED DESCRIPTION

Exemplary embodiments of the present disclosure provide a driving method and driver circuit implementing the method so as to alleviate the above mentioned disadvantages.

Exemplary embodiments are based on the idea of using a single PI controller that controls both $di_C/dt$ and $dv_{CE}/dt$ of the gate-controlled component. Due to the nature of turn-on and turn-off procedures, either the collector current or the collector-to-emitter voltage changes at a time thereby enabling the use of only one PI controller.

The active gate drive of exemplary embodiments descried herein provide highly dynamic control using simple hardware implementation. For the hardware implementation only simple measurement circuits, a constant reference signal during the complete switching operation and one single control amplifier can be specified. Due to the natural state transition from $di_C/dt$ to $dv_{CE}/dt$ control and vice versa, no active change of the control loop is needed during the switching transients providing maximum analog control bandwidth.

In accordance with exemplary embodiments of the present disclosure the change rate of collector current and the change rate of collector-to-emitter voltage can be controlled using a simple structure. The controlled change rates ensure that problems relating to high change rates or excessive losses are dealt with.

Figure 1A:
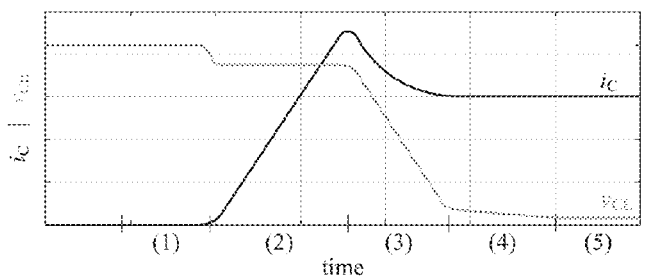
FIGS. 1a and 1b show schematic current and voltage waveforms of the inductive switching transients for turn-on and turn-off conditions, respectively, in accordance with an exemplary embodiment of the present disclosure.
Figure 1B:
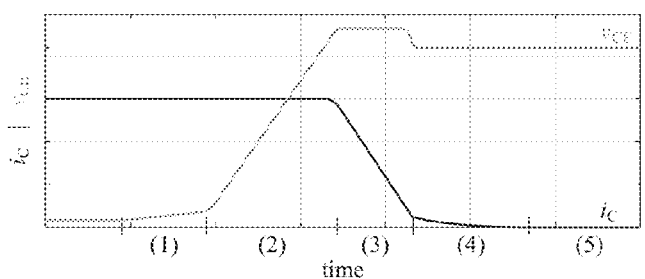

FIGS. 1a and 1b show schematic current and voltage waveforms of the inductive switching transients for turn-on and turn-off conditions, respectively, in accordance with an exemplary embodiment of the present disclosure. The main characteristic of the inductive (hard) switching transients of an IGBT is that the sections of current and voltage change are always succeeding each other for the turn-on and turn-off operation as depicted in FIGS. 1a and 1b and described in Table I.

TABLE I

Section description for the inductive switching transients according to FIGS. 1a and 1b.

| | a) turn-on | b) turn-off |
|---|---|---|
| (1) | turn-on delay ($v_{Ge} < v_{th}$) | charge large $C_{GC}$ |
| (2) | $di_C/dt$ | $dv_{CE}/dt$ |
| (3) | $dv_{CE}/dt$ | $di_C/dt$ |
| (4) | discharge large $C_{GC}$ | tail current |
| (5) | on-state | off-state |

As shown in FIG. 1a that the collector current increases in section (2) of the turn-on procedure. In the same section the collector emitter voltage stays almost constant.

Due to this temporal separation of the current and voltage slopes, ideally, $dv_{CE}/dt$ is zero during the collector current change and $di_C/dt$ is zero during the collector-emitter voltage change. This fact permits the utilization of a combined $di_C/dt$ and $dv_{CE}/dt$ closed-loop control, e.g., both control loops are active simultaneously, with one single Proportional-integral controller (PI controller). In doing so, a natural state transition from the current to the voltage slope control and vice versa occurs due to the hard switching of the IGBT. The block diagram for this combined current and voltage slope control is depicted in FIG. 2.

Figure 2:
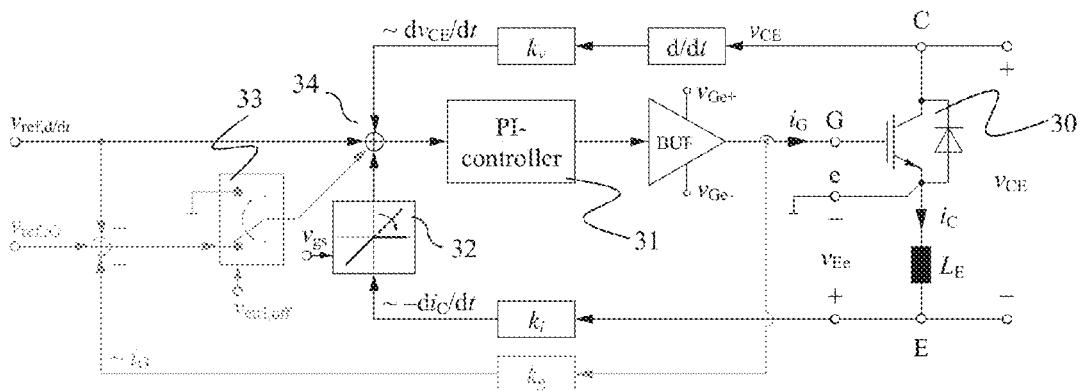
FIG. 2 shows the block diagram of the combined current and voltage slope control in accordance with an exemplary embodiment of the present disclosure.

FIG. 2 shows the block diagram of the combined current and voltage slope control in accordance with an exemplary embodiment of the present disclosure. FIG. 2 shows the controlled component 30 having a gate G, collector C and emitter E. The output of the PI controller 31 is fed to a buffer circuit BUF which amplifies the signal from the PI controller and feeds gate current $i_G$ to the gate of the component. A first feedback loop carries a feedback signal having a value of collector-to-emitter voltage $v_{CE}$ of which a time derivative is taken. This signal is further amplified by gain $k_v$. The signal fed back to the controller is thus proportional to the time derivative of the collector-to-emitter voltage $dv_{CE}/dt$. A second feedback loop carries a feedback voltage signal which is proportional to the time derivative of collector current which is obtained as a voltage between the emitter E and the auxiliary emitter e of the component 30 due to the parasitic bonding wire inductance $L_E$.

The input reference signal $v_{ref,d/dt}$, that is set once at the beginning of every switching operation, is kept at a constant value and defines in combination with the feedback gains $k_i$ and $k_v$ the set-points for both control variables according to (1) and (2).

$$\frac{di_C}{dt_{ref}} = \frac{v_{ref,d/dt}}{k_i \cdot L_E} \quad (1)$$

$$\frac{dv_{CE}}{dt_{ref}} = \frac{v_{ref,d/dt}}{k_v} \quad (2)$$

With the above equations, it is possible to define the requested voltage and current slopes by setting the values of gains.

As the dynamic feedback provides system information during the current and voltage slopes, the PI controller is not able to control the IGBT properly during the turn-on and turn-off delay sections (sections (1) in FIGS. 1a and 1b).

There, the controller can increase the gate current too much resulting in an overshoot of $di_C/dt$ during turn-on and $dv_{CE}/dt$ during turn-off. A solution to control the system state, e.g., the gate current $i_G$, prior to a current or voltage slope feedback is described in the following.

Missing feedback during the delay sections of the switching transients can lead to excessive gate current causing overshoots in $di_C/dt$ at turn-on and $dv_{CE}/dt$ at turn-off. If the gate current is actively controlled in these sections, the overshoots can be prevented. Such a gate current control can be implemented into the active gate drive topology without changing the current and voltage slope control part as depicted in FIG. 2 (shown in gray).

The optional gate current control receives measurement from the gate current $i_G$. The third control loop includes gain kg and the feedback signal is subtracted from the reference $v_{ref,iG}$ given for the optional control loop. Similarly, the input reference signal $v_{ref,di/dt}$ is subtracted from the gate current control reference. The obtained error signal is fed to a multiplexer 33 allowing disabling the gate current control loop. The output of the multiplexer is further connected to the PI controller 31.

To initiate the switching operation, both control loops are activated simultaneously by setting the reference signals and the multiplexer. Subsequently, the gate current control should be deactivated with the multiplexer not later than in the beginning of the current rise at turn-on or the voltage rise at turn-off. This point in time can be derived by a specific time after the initiation of the switching operation, reaching a predefined gate-emitter voltage level or the point of active current or voltage slope feedback at the latest. In the example of FIG. 2, the multiplexer 33 is controlled with input $v_{ctrl,off}$.

For the hardware implementation of the active gate drive, the $di_C/dt$ and $dv_{CE}/dt$ feedback signals should be provided, the control error should be generated, the PI controller should be implemented and a highly dynamic and powerful output buffer has to be inserted as gate driving output stage. The schematic of the proposed active gate drive is shown in FIG. 3 and will be discussed in the following.

Figure 3:
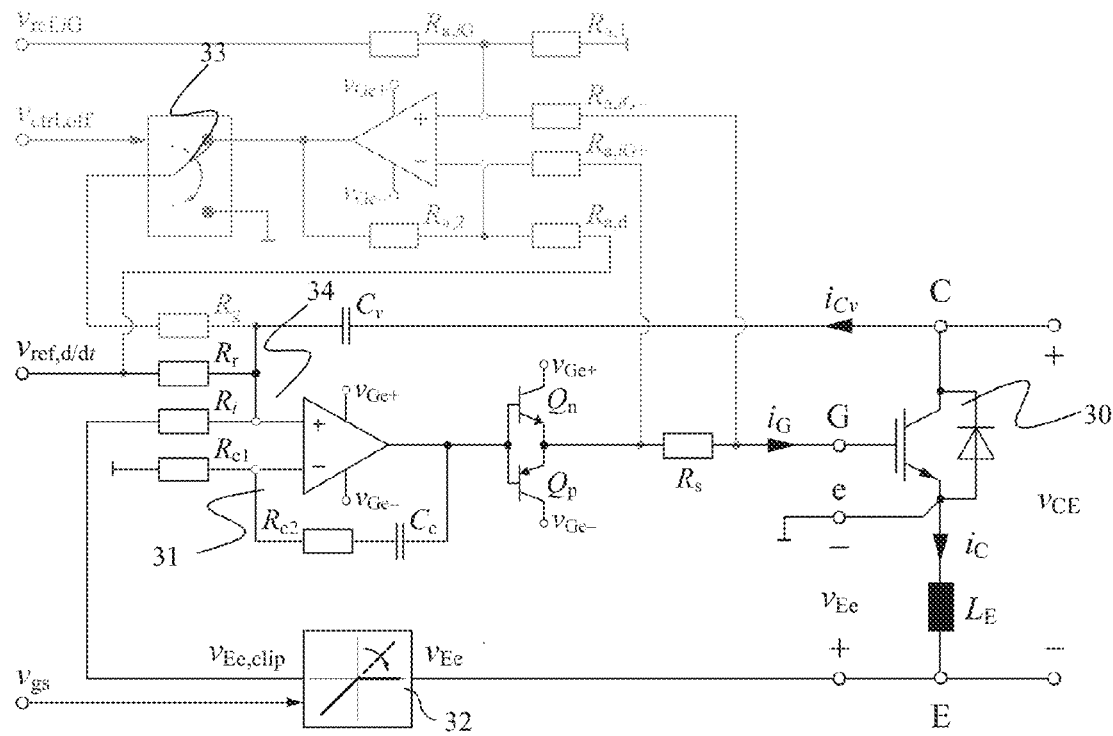
FIG. 3 shows an example of schematic of the active gate drive in accordance with an exemplary embodiment of the present disclosure.

FIG. 3 shows an example of schematic of the active gate drive in accordance with an exemplary embodiment of the present disclosure. The needed measurements of $di_C/dt$ and $dv_{CE}/dt$ feature a duality. For the current slope measurement, the voltage across an inductance in the current path, e.g. the emitter's parasitic bonding wire inductance $L_E$, which is proportional to the current time derivative, is used as feedback. For the voltage slope measurement, the current of a capacitor $C_v$ in the voltage path is used as feedback proportional to the voltage time derivative. Neglecting any parasitic inductance and assuming a (+)-input of the operational amplifier that is comparably small with regard to $v_{CE}$, the two feedback signals can be expressed as per (3) and (4).

$$v_{Ee} \approx -L_E \cdot di_C/dt \quad (3)$$

$$i_{Cv} \approx C_v \cdot dv_{CE}/dt \quad (4)$$

For the generation of the control error, e.g., summing up the reference and feedback signals, a passive network can be deployed as depicted in FIG. 3. Due to the capacitor $C_v$ in the voltage time derivative feedback path, a low-pass characteristic of all remaining signals occurs. This capacitor value can be in the range of several picofarads thus a low-pass time constant in the low nanosecond range results. If this low-pass characteristic, depending on all resistor and capacitor values of the reference signal generation, would cause a problem, a buffer amplifier could be inserted to decouple the voltage slope feedback.

The PI controller 31 can be implemented with a fast operational amplifier as shown in FIG. 3, where the P- and the I-part result according to (5) and (6).

$$P = 1 + R_{c2}/R_{c1} \quad (5)$$

$$I = 1/(R_{c1} \cdot C_c) \quad (6)$$

As output buffer, a push-pull emitter-follower $Q_n$, $Q_p$ can be used to provide the high analog bandwidth and needed current gain. In doing so, the parallel connection of lower current rated bipolar transistors compared to single devices is beneficial in terms of current gain (typ. $h_{FE} > 100$) and analog bandwidth ($f_T > 100$ MHz).

FIG. 3 also shows an example of a circuit used for producing the gate current control. For example, the gate current can be measured as a voltage across resistor $R_s$ which is placed in the gate current path. This voltage signal is fed to an operational amplifier circuit which also receives gate current reference voltage $V_{ref,iG}$. The operational amplifier circuit with resistors $R_{a,iG}$, $R_{a,1}$, $R_{a,iG-}$, $R_{a,iG+}$, $R_{a,d}$ and $R_{a,2}$ produce the functionality of the optional feedback loop of FIG. 2. The summation element 34 of FIG. 2 is formed of resistors $R_g$, $R_r$, $R_i$ and capacitor $C_v$ connected to the operational amplifier of the PI controller 31.

Ideally, the current and voltage transients of the inductive switching are temporally separated from each other as illustrated above enabling a combined $di_C/dt$ and $dv_{CE}/dt$ control. However, during the turn-on voltage slope, the collector current is reduced after the peak reverse recovery current leading to unwanted additional feedback. This decrease of collector current is shown in FIG. 1a at the section (3).

Figure 4:
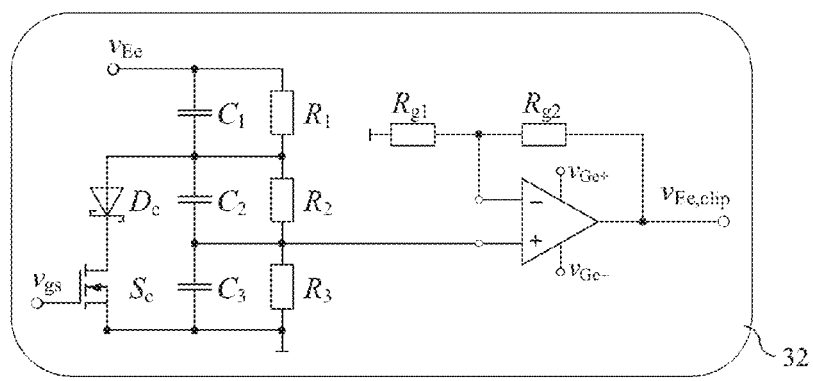
FIG. 4 shows an example of schematic of a clipping circuit in accordance with an exemplary embodiment of the present disclosure.

FIG. 4 shows an example of schematic of a clipping circuit in accordance with an exemplary embodiment of the present disclosure. For the control topology, a negative $di_C/dt$ feedback during the turn-on voltage slope should be prevented for achieving an optimal control of $dv_{CE}/dt$. This can be achieved by inserting a clipping circuit shown in FIG. 4 into the $di_C/dt$ feedback path as shown in FIG. 3 with reference numeral 32. With the clipping circuit of the embodiment, the negative current slope feedback values are limited to the diode $D_C$ forward voltage scaled down by the compensated voltage divider ($R_2 \| C_2$, $R_3 \| C_3$) when it is enabled. The clipping circuit of the embodiment is enabled during the turn-on transients only with switch $S_C$. As control $v_{gs}$ is applied to the gate of the switch $S_C$, positive current occurring during negative current slope feedback can flow through diode $D_C$ and the voltage the operational amplifier of FIG. 4 is limited by the forward voltage of the diode and the voltage divider. The operational amplifier together with the resistors $R_{g1}$ and $R_{g2}$ set the gain of the circuit. The voltage of the circuit is output as signal $v_{Ee,clip}$ shown also in FIG. 3. As control signal $v_{gs}$ for enabling the clipping circuit the gate signal input of the gate driver may directly be used, e.g. the clipping circuit can be enabled during the complete turn-on switching transients and disabled during the complete turn-off switching transients.

In accordance with an exemplary embodiment, double-pulse tests performed on an exemplary circuit of the present disclosure can lead to the following measurement results. The test setup consisted of a DC link (up to 1 kV, 320 μF), one Infineon FF450R12KE4 IGBT half-bridge module 1.2 kV, 450 A), an air-core pulse inductor (53 μH) and a busbar interconnecting all components.

Figure 5:
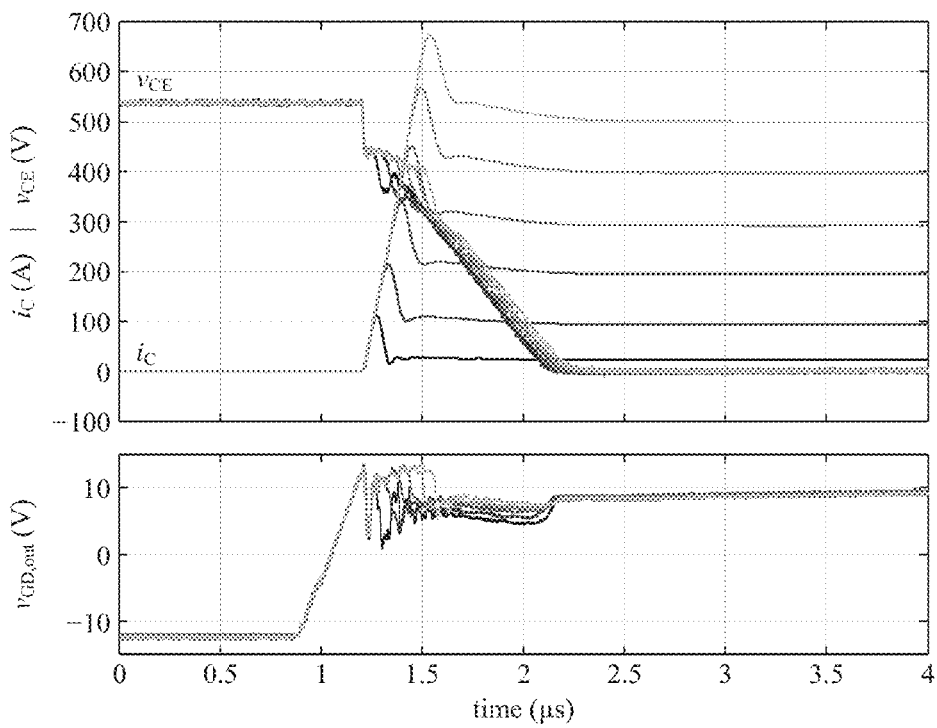
FIG. 5 shows measured collector current $i_C$, collector-emitter voltage $v_{CE}$ and gate driver output voltage $V_{GD,out}$ during turn-on for varied load currents in accordance with an exemplary embodiment of the present disclosure.

FIG. 5 shows measured collector current $i_C$, collector-emitter voltage $v_{CE}$ and gate driver output voltage $v_{GD,out}$ during turn-on for varied load currents in accordance with an exemplary embodiment of the present disclosure. For the reference values of $di_C/dt_{ref} = 2$ kA/μs and $dv_{CE}/dt_{ref} = 0.5$ kV/µs, the current and voltage transients of the IGBT have been measured for different values of the load current as depicted in FIG. 5. The active gate drive adjusts the output voltage $V_{GD,out}$ to follow the current slope reference until the peak reverse recovery current is taken and then, due to the natural state transition, controls the voltage slope to its reference value. The plots are performed for six different load current values.

Figure 6:
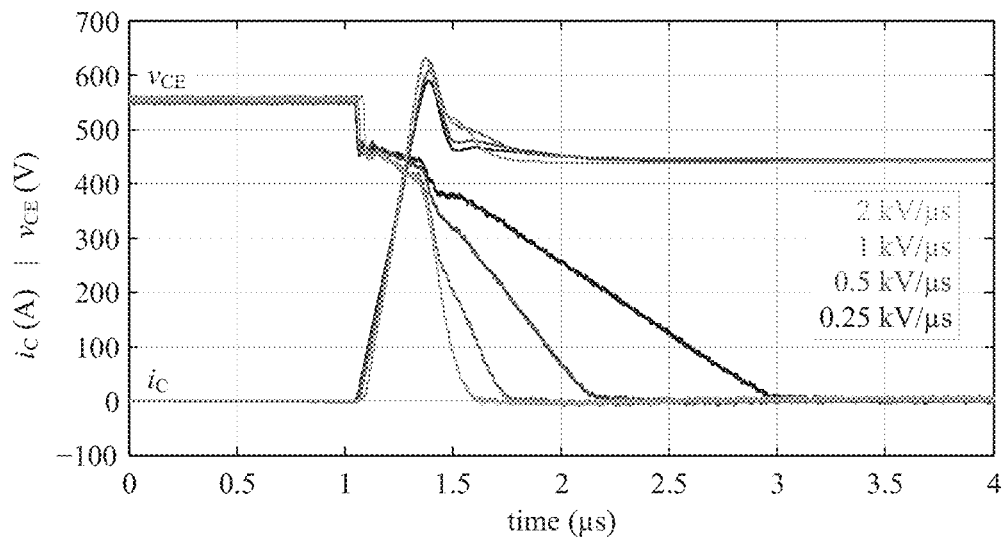
FIG. 6 shows measured collector current $i_C$ and collector-emitter voltage $v_{CE}$ during turn-on for varied voltage slopes in accordance with an exemplary embodiment of the present disclosure.
Figure 7:
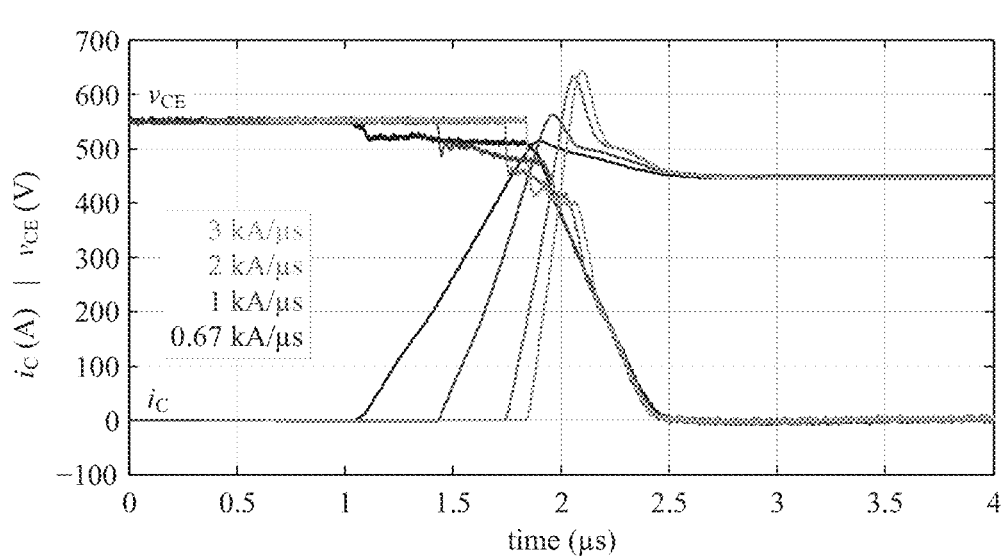
FIG. 7 shows measured collector current $i_C$ and collector-emitter voltage $v_{CE}$ during turn-on for varied current slopes in accordance with an exemplary embodiment of the present disclosure.

FIG. 6 shows measured collector current $i_C$ and collector-emitter voltage $v_{CE}$ during turn-on for varied voltage slopes in accordance with an exemplary embodiment of the present disclosure. FIG. 7 shows measured collector current $i_C$ and collector-emitter voltage $v_{CE}$ during turn-on for varied current slopes in accordance with an exemplary embodiment of the present disclosure. As shown in FIG. 6, the voltage slope reference is varied in the range of $dv_{CE}/dt_{ref}$=0.5 kV/µs . . . 2 kV/µs and in FIG. 7, the current slope reference is varied in the range of $di_C/dt_{ref}$=0.67 kA/µs . . . 3 kA/µs for nominal load current. In both cases, the active gate drive is able to accurately control the current and the voltage slopes to their reference values.

As understood, the circuit structures described above with reference to the drawings are merely examples of possible constructions that are suitable for producing the desired functions. It is clear that certain circuit structures such as the clipping circuit may be formed using other structures.

The component controlled with the circuit and method of the disclosure can be an IGBT component. Other gate-controlled components include MOSFETs and BJTs and alike.

Thus, it will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. A gate drive circuit for controlling a gate-controlled component comprising:
   a PI controller configured to receive an input reference signal ($v_{ref,d/dt}$) and to control a gate voltage of the gate-controlled component;
   a first feedback loop for the PI controller that provides feedback from a time derivative of a collector-to-emitter voltage ($v_{CE}$) of the controlled component, the first feedback loop having first gain ($k_v$); and
   a second feedback loop for the PI controller that provides feedback from a time derivative of the collector current ($i_C$) of the controlled component, the second feedback loop having second gain ($k_i$),
   wherein the second feedback loop includes a clipping circuit that modifies the feedback signal in the second feedback loop during turn-on of the controlled component when the time derivative of the collector current is negative.

2. The gate drive circuit according to claim 1, comprising:
   a gate current control loop connected to the PI controller, wherein the control loop receives a feedback signal from the gate current and is configured to control the gate current during turn-on and turn-off delays.

3. The gate drive circuit according to claim 1, comprising:
   a buffer circuit (BUF) that amplifies an output signal from the PI controller to drive the gate-controlled component.

4. The gate drive circuit according to claim 1, wherein the clipping circuit comprises a controlled component for enabling the clipping circuit.

5. The gate drive circuit according to claim 4, wherein the controlled component is a voltage-controlled switch.

6. The gate drive circuit according to claim 4, wherein once enabled, the clipping circuit limits the output.

7. The gate drive circuit according to claim 1, wherein the first feedback loop includes a capacitor that is connected to receive a collector-to-emitter voltage of the controlled component, and
   wherein the time derivate of the collector-to-emitter voltage is determined as a voltage level due to the capacitor being responsive to the collector-to-emitter voltage change.

8. The gate drive circuit according to claim 1, wherein the time derivative of the collector current is determined as a voltage level from the voltage over a known inductance of the circuit.

9. The gate drive circuit according to claim 8, wherein the known inductance of the circuit is a parasitic bonding wire inductance of the emitter.

10. A method for controlling a gate-controlled component by using a PI controller adapted to receive an input reference signal ($v_{ref,d/dt}$) and to control a gate voltage of the gate-controlled component, the method comprising:
   providing the input reference signal ($v_{ref,d/dt}$) to the PI controller;
   obtaining, via a first feedback loop, a first feedback signal for the PI controller from a time derivative of a collector-to-emitter voltage ($v_{CE}$) of the controlled component;
   obtaining, via a second feedback loop, a second feedback signal for the PI controller from the time derivative of the collector current ($i_C$) of the controlled component; and
   modifying the feedback signal in the second feedback loop during turn-on of the controlled component when the time derivative of the collector current is negative.

11. The method according to claim 10, wherein a capacitor is connected to receive a collector-to-emitter voltage of the gate-controlled component, the method comprising:
   determining the time derivate of the collector-to-emitter voltage as a voltage level based on a capacitor that is responsive to a change in the collector-to-emitter voltage.

12. The method according to claim 10, wherein a gate current control loop is connected to the PI controller, the method comprising:
   controlling the gate current during turn-on and turn-off delays based on a feedback signal received by the gate current control loop.

13. The method according to claim 10, wherein the second feedback loop includes a clipping circuit, the method comprising:
   enabling the clipping circuit via a controlled component.

14. The method according to claim 13, wherein the clipping circuit includes a voltage-controlled switch and enabling the clipping circuit comprises:
   applying a voltage to a gate of the voltage-controlled switch.

15. The method according to claim 13, comprising:
   limiting an output of the gate drive circuit when the clipping circuit is enabled.

* * * * *